United States Patent
Kivikero et al.

(10) Patent No.: US 9,301,394 B2
(45) Date of Patent: Mar. 29, 2016

(54) MANUFACTURING METHOD AND ELECTRONIC MODULE WITH NEW ROUTING POSSIBILITIES

(75) Inventors: Antti Kivikero, Lahela (FI); Pekka Kostensalo, Lahti (FI); Jaakko Hekki Tapie Moisala, Munich (DE)

(73) Assignee: GE Embedded Electronics Oy, Helsinki (FI)

( * ) Notice: Subject to any disclaimer, the term of this patent is extended or adjusted under 35 U.S.C. 154(b) by 1106 days.

(21) Appl. No.: 13/698,670

(22) PCT Filed: May 19, 2010

(86) PCT No.: PCT/FI2010/050403
§ 371 (c)(1),
(2), (4) Date: Mar. 25, 2013

(87) PCT Pub. No.: WO2010/133767
PCT Pub. Date: Nov. 25, 2010

(65) Prior Publication Data
US 2013/0175075 A1    Jul. 11, 2013

(30) Foreign Application Priority Data

May 19, 2009   (FI) .................................. 20095557

(51) Int. Cl.
*H05K 1/18*        (2006.01)
*H01L 23/31*       (2006.01)
(Continued)

(52) U.S. Cl.
CPC .............. *H05K 1/18* (2013.01); *H01L 23/3114* (2013.01); *H01L 23/5389* (2013.01); *H01L 24/19* (2013.01); *H01L 24/20* (2013.01); *H01L 24/31* (2013.01); *H01L 24/83* (2013.01); *H01L 21/4821* (2013.01); *H01L 23/5386* (2013.01); *H01L 23/552* (2013.01); *H01L 2224/04105* (2013.01); *H01L 2224/20* (2013.01); *H01L 2224/2919* (2013.01); *H01L 2224/32245* (2013.01); *H01L 2224/8385* (2013.01); *H01L 2224/83192* (2013.01); *H01L 2224/92144* (2013.01); *H01L 2924/014* (2013.01); *H01L 2924/01013* (2013.01); *H01L 2924/01023* (2013.01); *H01L 2924/01024* (2013.01);
(Continued)

(58) Field of Classification Search
USPC .................................. 361/818, 816; 174/260
See application file for complete search history.

(56) References Cited

U.S. PATENT DOCUMENTS 6,147,393 A * 11/2000 Zommer ....................... 257/501
6,501,169 B1   12/2002 Aoki et al.
(Continued)

FOREIGN PATENT DOCUMENTS

FR        2572849 A1    5/1986
JP        2001332866    11/2001

*Primary Examiner* — Andargie M Aychillhum
(74) *Attorney, Agent, or Firm* — Seppo Laine Oy

(57) ABSTRACT

Disclosed is an electronic module with high routing efficiency and other new possibilities in conductor design. The electronic module comprises a wiring layer (3), a component (1) having a surface with contact terminals (2) and first contact elements (6) that connect at least some of the contact terminals (2) to the wiring layer (3). The electronic module is provided with at least one conducting pattern (4) on the surface of the component (1) but spaced apart from the contact terminals (2). The electronic module further comprises a dielectric (5) and at least one second contact element (7) that connects the conducting pattern (4) to the wiring layer (3) through a portion of said dielectric (5). Methods of manufacturing such modules are also disclosed.

20 Claims, 5 Drawing Sheets

(51) Int. Cl.
*H01L 23/00* (2006.01)
*H01L 23/538* (2006.01)
*H01L 21/48* (2006.01)
*H01L 23/552* (2006.01)

(52) U.S. Cl.
CPC .......... *H01L2924/01029* (2013.01); *H01L 2924/0132* (2013.01); *H01L 2924/01033* (2013.01); *H01L 2924/01058* (2013.01); *H01L 2924/01074* (2013.01); *H01L 2924/01078* (2013.01); *H01L 2924/01079* (2013.01); *H01L 2924/01082* (2013.01); *H01L 2924/0665* (2013.01); *H01L 2924/07802* (2013.01); *H01L 2924/12042* (2013.01); *H01L 2924/14* (2013.01); *H01L 2924/19041* (2013.01); *H01L 2924/19042* (2013.01); *H01L 2924/19043* (2013.01); *H01L 2924/3025* (2013.01)

(56) References Cited

U.S. PATENT DOCUMENTS

| | | |
|---|---|---|
| 2003/0015342 A1* | 1/2003 | Sakamoto et al. ............ 174/250 |
| 2004/0183192 A1 | 9/2004 | Otsuka |
| 2004/0251531 A1 | 12/2004 | Yang et al. |
| 2005/0255686 A1 | 11/2005 | Yamano |
| 2006/0012054 A1 | 1/2006 | Memis |
| 2006/0125082 A1 | 6/2006 | Wakabayashi |
| 2007/0034405 A1 | 2/2007 | Brown |
| 2008/0003716 A1 | 1/2008 | Takahashi |
| 2008/0136003 A1 | 6/2008 | Pendse |
| 2008/0196930 A1 | 8/2008 | Tuominen et al. |
| 2009/0053858 A1 | 2/2009 | Ko et al. |

* cited by examiner

MANUFACTURING METHOD AND ELECTRONIC MODULE WITH NEW ROUTING POSSIBILITIES

TECHNICAL FIELD

The present invention relates to electronic modules including a component, such as an active microchip or a passive component. In addition to the component, such electronic modules include at least one wiring layer and a dielectric between the two.

In particular, the present invention relates to electronic modules having the component embedded in the dielectric. Such electronic modules may be component packages, smart cards or circuit boards, for instance. The circuit boards include boards with one or two wiring layers and also multi-layer circuit boards having several wiring and dielectric layers.

The present invention relates also to methods of manufacturing the above-described electronic modules.

BACKGROUND ART

U.S. Pat. No. 6,501,169 (Aoki et al.) discloses a semiconductor device of a CSP (Chip Scale Package) structure.

U.S. Patent Application Publication No. 20070034405 A1 (Brown) addresses the problem of increasing routing efficiency in context of area array packages (BGAs and CGAs) mounted on printed circuit boards (PCB or circuit card). The technology should be capable of providing all the necessary escape routes from the electronic device and at the same time be cost effective. One of the mentioned cost factors is the overall layer count. On the other hand, higher pin counts and finer pitches require improved routing solutions. The Brown U.S. publication provides a PCB and BGA package using rows/columns of micro-vias to create printed wiring boards (PWB) routing channels in a BGA that couple with BGA interconnect vias. Simple patterns, created through the reconfiguration of printed circuit board interconnect structures, permit an increase in escape densities that in turn enable the routing of area array devices in fewer layers. The disclosed patterns provide a combination of through and micro-via interconnects to achieve a better routing capability.

A high wireability microvia substrate is discloses also in U.S. Patent Application Publication No. 20060012054 A1 (Memis).

As to the manufacture of the packages itself, U.S. Patent Application Publication No. 20090053858 A1 (Ko et al.), for instance, discloses using a redistribution substrate for providing the escape routes from the component. The solution of the Ko et al. U.S. publication can effectively provide the redistribution lines in case the number of component lands is not excessive.

U.S. Patent Application Publication No. 20080136003 A1 (Pendse) discloses a multi-layer semiconductor package comprising a base substrate with a semiconductor die mounted on a top side of the base substrate. The package further comprises an interposer substrate mounted on top of the die for mounting of additional electronic components.

U.S. Patent Application Publication No. 20040251531 A1 (Yang et al.) discloses a stack type flip-chip package including a substrate board, a first chip, a second chip, a packaging material and a heat sink. The substrate board has bump contacts and line contacts thereon, wherein the bump contacts connect with the bonding pads on the active surface of the first chip via bumps. The back surface of the first chip has a redistribution circuit thereon including bump pads and line pads exposed by a passivation layer, wherein the bump pads connect with the bonding pads of the second chip via bumps, and the line pads are connected to the line contacts via conductive wires. The package further comprises an interposer substrate mounted on top of the die for mounting of additional electronic components.

U.S. Patent Application Publication No. 20080196930 A1 (Tuominen et al.) discloses a multi-layer circuit board with an embedded component. In an embodiment, the component can be connected optionally to either or both of two individual conductor pattern layers via electrical contacts manufactured by growing conductor material in respective contact openings. Ability to make contacts to either or both of the two wiring layers provides an opportunity for the flexible planning of the contacts of the components, and for the efficient use of space in the circuit-board structure.

JP 2001332866 A (MATSUSHITA ELECTRIC) discloses that an additional wiring pattern is made on a semiconductor component by means of semiconductor manufacturing processes. This additional wiring pattern is made on a wafer level before dicing the wafer. The additional wiring pattern can be connected to the conductors of an electronic module by means of conductive glue or solder.

Thus, the background art contains several different solutions that seek to provide high routing efficiency with an affordable price of the product. Despite these attempts, there remains need to seek further techniques with potentially improved properties in view of routing efficiency and price, in particular when it is aimed to increase the number of contacts of the components and narrow the pitch between the contact lands or bumps on the component.

DISCLOSURE OF INVENTION

It is an object of the present invention to create a new structure for electronic modules that can economically provide further possibilities in view of routing.

According to an aspect of the invention, there is provided an electronic module, comprising a wiring layer, a dielectric supporting the wiring layer, and a component that has a first surface with at least one contact terminal. The first surface of the component is provided with an additional passivation layer and the component is located such that the first surface with the additional passivation layer is in contact with the dielectric. There is also provided a conducting pattern on the additional passivation layer on the first surface of the component. The conducting pattern is spaced apart from each of the contact terminals, which means that the conducting pattern and the contact terminals are not in direct contact with each other. In the absence of direct contact, there is also no direct electrical contact between the two but any possible electrical contacts are made through other conducting elements of the electronic module. There is also no direct electrical contact between the conducting pattern and the electrical parts or the electronic devices of the component. The electronic module further comprises at least one first contact element for making electrical connection between the wiring layer and the at least one contact terminal, and at least one second contact element for making electrical connection between the wiring layer and the conducting pattern.

The conducting pattern on the additional passivation layer on the first surface of the component allows new possibilities for the design of the electronic modules. Therefore, the present invention makes it possible to construct new electronic modules that can economically provide further possibilities in view of routing, for instance. At the same time, the invention provides new possibilities also for the design of other conductive structures in the electronic modules. This is a considerable advantage and allows several useful embodiments.

According to an embodiment, the electronic module comprises a plurality of contact terminals on the component and a plurality of first contact elements that connect at least some of the contact terminals to the wiring layer. In order to improve the routing capability of the structure, or for some other reason, the electronic module is provided with at least one conducting pattern on the first surface side of the component but spaced apart from the contact terminals. The electronic module further comprises at least two of said second contact elements that connect the conducting pattern to the wiring layer at at least two contact locations. Advantageously, such conducting pattern and said second contact elements can be designed to provide a redistribution line on the first surface of the component and thereby to solve a routing problem without adding a further wiring layer to the whole structure.

According to another embodiment, the conducting pattern can be designed as a planar structure that proves a shield against electromagnetic interference (EMI) between the component and the wiring layer. In a further embodiment, the planar structure is connected to a ground potential via at least one of said second contact elements. This allows designing component packages and other electronic modules even such that signal lines and terminal pads are located over the component. These factors may also contribute achieving savings in size and wiring area. Flexibility of design is also increased by means of such embodiments.

Thus, the conducting pattern on the first surface side of the component can be used as routing lines, such as so called redistributing lines, and/or as EMI shield, for instance. In most typical embodiments using semiconductor components, the first surface of the component means a surface of a passivation layer prepared on the surface of the semiconductor material. According to the embodiments, an additional passivation layer is prepared on the surface of an underlying passivation layer, i.e. on the first surface of the component. The conducting pattern can be manufactured in any form. The conducting pattern can be, for example, an elongate line, a branched line, a curved line, a plate-like pattern or any combination thereof.

The term "passivation layer" refers to the passivation prepared on the surface of the semiconductor component by means of semiconductor manufacturing methods. The passivation layer may therefore be made of suitable nitride or oxide, for instance. The most typical examples are $SiO_2$ and $Si_3N_4$. The term "additional passivation layer" refers to a further passivation layer made on the passivation layer that forms part of the semiconductor component. This "additional passivation layer" can be made of polymer or epoxy based material, such as polyimide (PI), polyphenoleether (PPE) or benzocyclobutene (BCB). The thickness of the additional passivation layer is typically between 3 to 10 micrometers. The term "first surface side" of the component refers generally to the structures and surface on the side of the component to which the first surface is directed. These first surface side structures and surfaces include the actual first surface and also the surface of the additional passivation layer.

The additional passivation layer provides significant benefits. One of the benefits is that the additional passivation layer equalizes mechanical stresses that are caused by differences in thermal expansion of the semiconductor and the conducting pattern manufactured on the first surface side of the component. Another benefit is that the additional passivation layer improves electrical insulation and reduces coupling between the semiconductor circuit and the conducting pattern. A further benefit is that, when some of the contact lands of the component are not needed for connection, these contact lands can be covered by the additional passivation layer. By covering the non-active contact lands, possible problems with electrochemical migration can be alleviated. Moreover, by using the additional passivation layer contact openings for the contact lands of the component can be kept as small as possible in order to avoid problems with electrochemical migration.

For the above reasons, preferred embodiments comprise first preparing an additional passivation layer on the surface of the component and then making the conducting pattern on the additional passivation layer. The electronic module can also comprise a conducting track resembling the conducting pattern but directly connected to at least one of the contact terminals.

According to a routing embodiment, in case the planned routes include one or a few cross-overs that would require an addition of a further wiring layer in the module, the necessary cross-overs can be prepared with the aid of said second contact elements and the conducting pattern manufactured on the surface of the component itself. Then, it is possible to dispense with the need of further wiring layer and achieve the associated savings in manufacturing costs. It is also possible that the thickness of the electronic module can be reduced by means of the solution according to such an embodiment. Even the planar surface required by the necessary routing lines could be reduced in such embodiments as the cross-sections of the microvias manufactured to the component lands or bumps, and also to the conducting pattern on the first surface side of the component, are typically smaller than the cross-sections of the vias typically used to connect the wiring layers of the circuit board structure.

Embodiments provide also an economical method for providing the additional structural elements of the conducting pattern and second contact elements connected to the conducting pattern. Namely, according to an embodiment, the conducting pattern is manufactured during a bumping process used to prepare of finalize the contact terminals of the component, for example, in a bumping plant of semiconductor chips or wafers. Thus, no additional manufacturing processes and process steps are required in such embodiments. Furthermore, even the second contact elements do not require additional processes or process steps as they can be formed during the same manufacturing processes that are used to form the first contact elements.

In an embodiment, the manufacture of the electronic module comprises growing conductive material on the contact terminals of the component to form part of the contact terminals and simultaneously growing conductive material on the first surface side of the component to form the conducting pattern. Thus, the contact terminals and the conducting pattern can at least partly be made of same materials. Also the structures of the contact terminals and conducting pattern can be similar, or have mutually corresponding or even identical parts in them. In addition, in case the electronic module comprises also a conducting track on the surface of the component that connects to the contact terminals, such a track can also be manufactured at the same time and using the same processes.

In another embodiment, which can suitable be used together with the previous embodiment, the manufacture of the electronic module comprises growing conductive material to form part of the first contact elements and simultaneously growing said conductive material to form part of the second contact elements. Thus, the first contact elements and the second contact elements can be made of same materials and can be similar in structure.

In a further embodiment, the electronic module comprises at least two separate conducting lines prepared on the first surface side of one individual component.

In a further embodiment, the electronic module comprises at least one conducting line that crosses the conducting pattern between said at least two contact locations. However, such crossing conducting line and conducting pattern are separated by a portion of the dielectric.

In a further embodiment, the first wiring layer, the conducting pattern, the component, and the first and second contact elements are embedded in the dielectric.

Thus, it is clear from the above discussion that there are also such embodiments that can provide a very compact and economical structure with good routing efficiency.

BRIEF DESCRIPTION OF DRAWINGS

For a more complete understanding of the present invention and the advantages thereof, the invention is now described with the aid of the examples and with reference to the following drawings, in which.

BEST MODE FOR CARRYING OUT THE INVENTION

Figure 1:
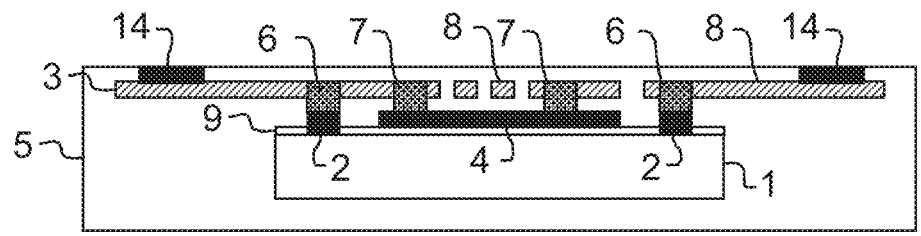
FIG. 1 presents a cross-section of an electronic module according to a first embodiment.

FIG. 1 presents an electronic module according to a first embodiment. The electronic module according to the first embodiment may be a component package, for instance. A corresponding structure can also be used as an electronic module comprising two or several embedded components 1, such as a circuit board.

The electronic module of FIG. 1 comprises a first wiring layer 3 that is constituted by conducting lines 8 of conducting material. The most typical conducting material is copper (Cu) but, of course, any material with sufficient conductivity and mechanical properties can be used. In the electronic module of FIG. 1, the first wiring layer 3 runs on a surface of a dielectric 5. The electronic module further comprises a component 1 embedded in the dielectric 5. The embedded component 1 has contact terminals 2, such as contact lands or more typically contact bumps, and a first surface extending between and around the contact terminals 2. The first surface is covered by an additional passivation layer 9 in the module of FIG. 1. The electronic module is provided with first contact elements 6 that connect at least some of the contact terminals 2 electrically to selected conducting lines 8 of the first wiring layer 3. The electronic module is also shown to have terminal pads 14 for making electrical contact with an external electronic circuitry. Thus, the structure of FIG. 1 could be used also as a component package for an integrated circuit, for instance. The structure of FIG. 1 could also be a smart card or a part of a larger circuit board.

Figure 2:
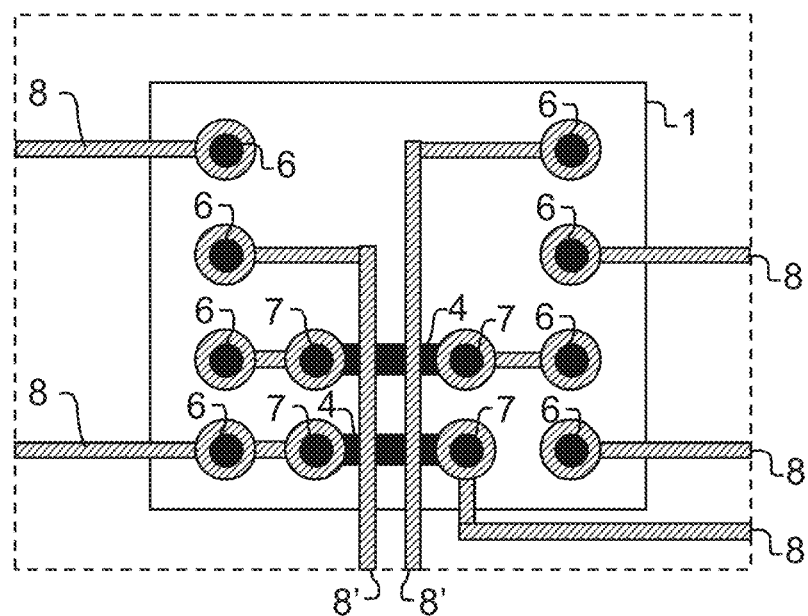
FIG. 2 presents a schematic top view of an electronic module according to an embodiment.

As can be seen in FIG. 1, the electronic module is a so called single-layer module, i.e. a module having only one wiring layer. In case the component has several contact terminals 2 and the module structure includes only one wiring layer (in this case the first wiring layer 3), certain electrical connections might appear unroutable due to crossing conducting lines 8. FIG. 2 exemplifies such a situation. As to the routing, FIGS. 1 and 2 can be read as though they would depict a single embodiment.

FIG. 2 shows a schematic "top view" of the electronic module. Herein, the "top view" refers to the orientation of the module as shown in FIG. 1. As can be seen in FIG. 2, conducting lines 8 of the first wiring layer 3 are connected to the contact terminals 2 (not shown in FIG. 2) of component 1 by means of first contact elements 6. Such conducting lines 8 are often called as escape routes. In this case, there are eight contact terminals 2 and respective conducting lines 8. However, two of the conducting lines 8 (marked as conducting lines 8') need to cross over two other conducting lines 8, and the electronic module should be provided with a further wiring layer if using techniques presented in the background art discussed above.

In the embodiments of FIGS. 1 and 2, the above-mentioned crossing problem can be solved by providing conducting patterns 4 on the first surface side of the component 1. Such conducting patterns 4 run on the additional passivation layer 9 between the contact terminals 2 but are not in direct contact with the contact terminals 2 but are spaced apart from them. Furthermore, the electronic module is provided with second contact elements 7 that connect the conducting patterns 4 to the conducting lines 8 of the first wiring layer 3. In FIGS. 1 and 2, the conducting patterns 4 have two contact locations at which they are connected by means of the second contact elements 7. In this construction, the routes can be designed such that some of the crossing escape routes, or other lines, can be lead via first ones of the second contact elements 7 to the conducting patterns 4 on the additional passivation layer 9, and then along the conducting patterns 4 as far as the second ones of the second contact elements 7 bringing the signals back to the respective conducting lines 8 at the first wiring layer 3. Thus, the problem of crossing lines can be solved even in case the electronic module contains only one wiring layer. It should be noted that benefits can be achieved also when the electronic module contains two or several wiring layers; also in these cases some of the crossings can be lead via conducting patterns 4 on the surface of the component 1 itself.

Figure 3:
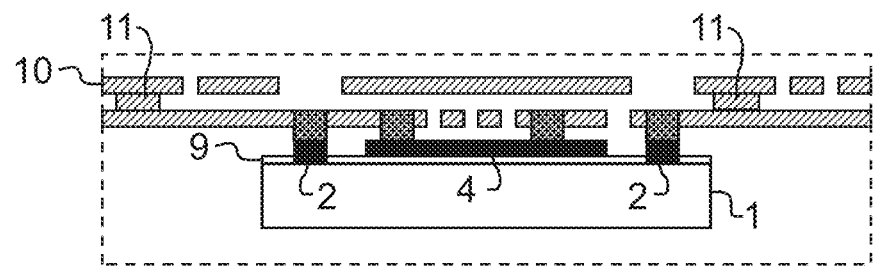
FIG. 3 presents a cross-section of an electronic module according to a second embodiment.

FIG. 3 shows a portion of an electronic module according to a second embodiment. Such a portion may be part of a component package or a circuit board, for instance.

Figure 4:
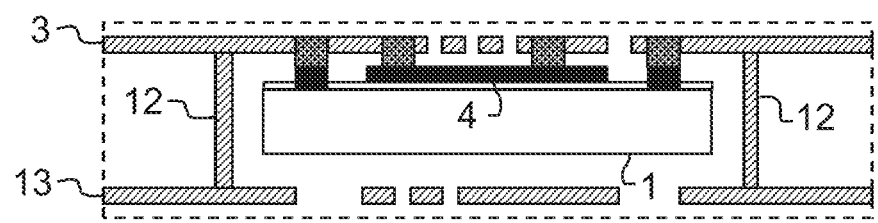
FIG. 4 presents a cross-section of an electronic module according to a third embodiment.
Figure 5:
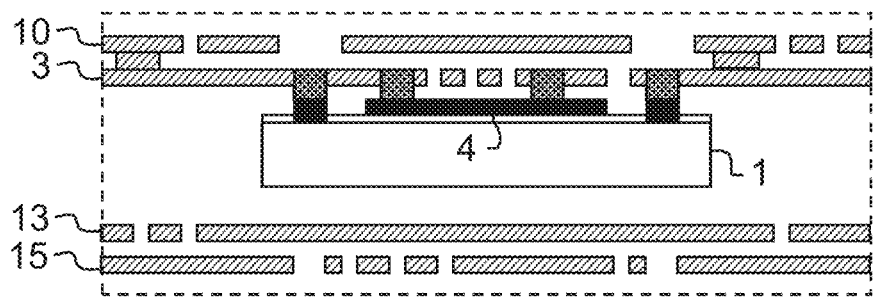
FIG. 5 presents a cross-section of an electronic module according to a fourth embodiment.

FIGS. 4 and 5 depict portions of electronic modules according to a third and fourth embodiment, respectively. As in the second embodiment, also the third and fourth embodiment may be used as parts of component packages or circuit boards, for instance In each of the first to fourth embodiments shown in FIGS. 1 to 5, the component 1 is embedded in the dielectric 5. This is, however, not mandatory but also embodiments leaving the rear surface of the component 1 (i.e. the surface opposite to the first surface) uncovered can be contemplated.

As shown by FIGS. 3 and 5, the electronic module may also comprise a second wiring layer 10 attached to the first wiring layer 3 by means of an intermediate layer of dielectric 5. The second wiring layer 10 is electrically connected to the first wiring layer 3 by means of vias 11. Also the second embodiment comprises at least one conducting pattern 4 that corresponds to the conducting patterns 4 of the first embodiment, and also the respective second contact elements for making electrical connections to the first wiring layer 3.

The embodiments of FIGS. 3 and 5 can also be modified such that the conducting pattern 4 is connected directly to the second wiring layer 10 by means of one or several extended contact elements in place of one or several of the second contact elements 7. The direct connection between the conducting pattern 4 and the second wiring layer 10 can also be made by means of an extended via corresponding to the vias 11. A third possibility is to first make a second contact element 7 and then a via 11 on top of the second contact element 7. Using similar techniques, it is also possible to make direct contacts between the contact terminals 2 and the second wiring layer 10.

As shown by FIGS. 4 and 5, the electronic module may also comprise a third wiring layer 13 at the rear side of the component 1 such that the component 1 is enclosed between the first and third wiring layers 3, 13. As is evident for a person skilled in the art, further wiring layers can also be added, such as a fourth wiring layer 15 shown in FIG. 5. In the embodiments shown by FIGS. 1 to 5, all the wiring layers are embedded in the dielectric 5. However, this is not mandatory but the outermost wiring layers may also run on the surface of the dielectric 5 and thus be exposed.

The embodiment of FIG. 4 shows also vertical conductors 12 that extend between the first and third wiring layers 3, 13. Such vertical conductors 12 can be used as electrical connections or to prevent mutual interference between the several adjacent components 1, for instance. Also the wiring layers can be used as shield structures against electromagnetic interference, if desired. For example, FIG. 5 can be constructed to show plate-like conducting structures in the second and third wiring layers 10, 13, at the location of the component 1. Such plate-like conductors can also be connected to a ground potential via conducting lines.

FIGS. 6 to 10 describe some possible manufacturing methods, and the associated intermediate products, for manufacturing electronic modules according to embodiments. However, any suitable method can be used.

Figure 6:
FIG. 6 presents, as a cross-section, one intermediate processing step when manufacturing an electronic module according to an embodiment.

In accordance with FIG. 6, it is possible to start the manufacture from a foil of conducting material. The foil can be a metal foil, such as a copper foil. A portion of the material of the foil will form part of the first wiring layer 3 in this process, but this is not necessarily so when using some of the various alternative manufacturing methods. In this particular example, the foil is made of copper. The thicknesses of the copper foils may be between 3-5 micrometers, for instance.

Then, the foil for the first wiring layer 3 is provided with first contact openings 16 located according to the positions designed for the first contact elements 6, and second contact openings 17 that are respectively located according to the positions designed for the second contact elements. Such holes can be manufactured with one of several chemical or mechanical manufacturing methods. Possible methods include, e.g. selective chemical etching, boring and laser drilling.

One of the possible modifications is to use a layered foil material as the starting material. The selected foil material can include, for example, one layer of copper and an insulating layer on top of it. The starting material foil may also comprise a carrier foil on top of the foil for the first wiring layer 3. The carrier foil is totally optional but it may be provide certain benefits in the manufacturing process. Thus, the starting material can be a suitable foil with carrier, for instance. The carrier can be any suitable commercially available material, in any suitable thickness. The material of the carrier foil can be, for example, copper. The carrier foil is later released from the foil structure, facilitated by a release layer on the surface of the carrier foil facing the layer 3.

Figure 7:
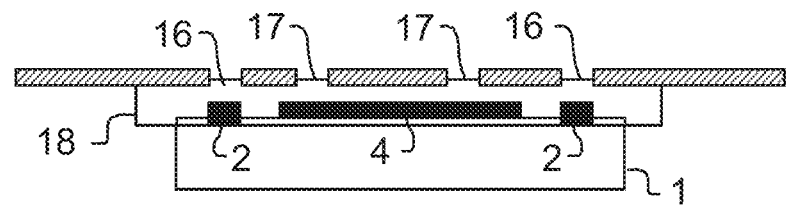
FIG. 7 presents another intermediate processing step after the step of FIG. 6.

FIG. 7 shows the next step of the process that includes attaching the component 1. The component has contact terminals 2 and at least one conducting pattern 4 prefabricated on its first surface side. The component 1 is aligned to the foil such that the contact terminals 2 are correctly located with regard to the first contact openings 16. At the same time, also the contact locations on the at least one conducting pattern 4 become correctly located with regard to the second contact openings 17. The component is then attached to the foil with the aid of insulating adhesive 18.

Figure 8:
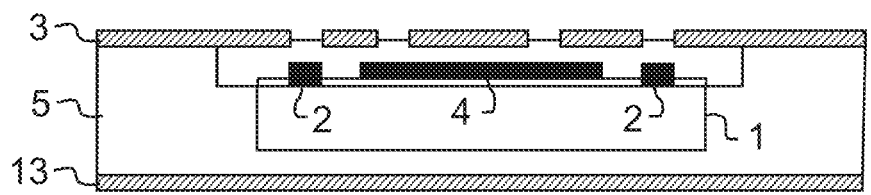
FIG. 8 presents a further intermediate processing step after the step of FIG. 7.

Next, the component 1 is embedded in insulating material that forms part of the dielectric 5. This is done by laminating layer or layers of insulating material between the intermediate product of FIG. 7 and another copper foil that is intended to be used as a third wiring layer 13. The insulating material may be so-called prepreg, for instance. FIG. 8 shows the product after these process steps.

As can be seen in FIGS. 7 and 8, the first contact openings 16 were partly filled with the insulating adhesive 18 when attaching the component 1. The next step is to remove the excess adhesive from the contact openings and from top of the contact terminals 2. This can be made, for example, by $CO_2$ laser ablation via the first contact openings 16, which can be used as mask in the process when using $CO_2$ laser beam that is not effective against the metal of the first wiring layer 3. During this micro via cleaning process, contact holes are opened up to the surface of the contact terminals 2. At the same time, also the surface of such contact terminals 2 is cleaned. A corresponding or exactly the same process is applied also with regards to the second contact openings 17 in order to remove excess adhesive from these contact openings and from the contact locations on top of the conducting patterns 4. Thus, also the relevant areas of the surface of the conducting patterns 4 are cleaned.

Figure 9:
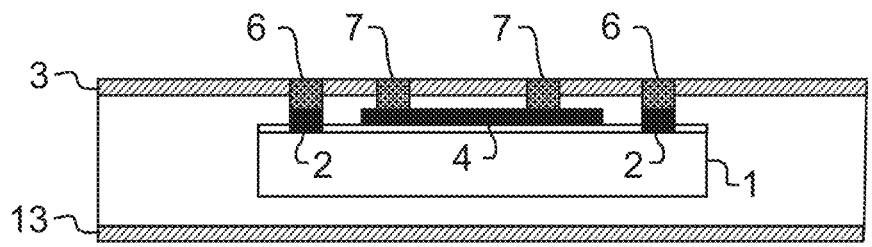
FIG. 9 presents a further intermediate processing step after the step of FIG. 8.

Then, a micro via metallization is performed. This can be done by copper deposition to the micro via, for instance. FIG. 9 shows the product after these process steps.

During the micro via metallization step, the contact holes are filled with one or more conducting materials, such as copper. The filled contact holes form the first contact elements 6 and the second contact elements 7 via respectively the first contact openings 16 and the second contact openings 17. From the metallurgical point of view, such first and second contact elements 6, 7 extend from the surface of the contact terminals 2 and the conducting patterns 4 respectively into the first and second contact openings 16, 17 in the first wiring layer 3. However, when referring to the height of the first and second contact elements 6, 7 in this document, the contact element may also be thought to end at the surface of the first wiring layer 3 facing the component 1. In this interpretation, the rest of the metal of the first and second contact elements 6, 7 is considered as part of the conducting lines 8 in the first wiring layer 3. This assumption is practical, but as stated already above, from the metallurgical point of view there is a hole in the conducting line 8 into which the material of the first or second contact element 6, 7 protrudes, when the process of FIGS. 6 to 10 is used.

Figure 10:
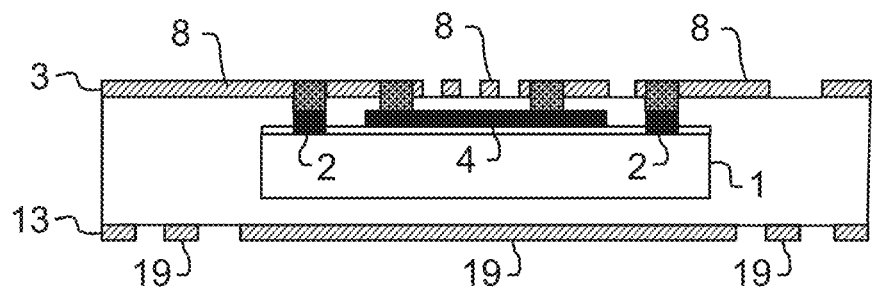
FIG. 10 presents a further processing step after the step of FIG. 9.

FIG. 10 shows the product after a patterning step, in which at least the first wiring layer 3 is patterned to form the conducting lines 8. One of the patterning processes known in the art can be used. At the same time, also the third wiring layer 13 can be patterned to form third conducting lines 19.

The module of FIG. 10 can be the end-product of the manufacturing process. It is also possible to continue the process by surface finishing step, solder mask and NI/Au plating or OSP, for instance.

Also other methods can be used in manufacturing the electronic modules according to the embodiments. Examples of such other possible methods include modifications of the methods described in the U.S. patent application Ser. Nos. 10/550,023, 10/572,340, 11/659,190, 11/570,673, 11/667, 429, 11/791,547, 11/587,586 and 11/917,711, which are incorporated herein by reference.

The dimensions of the various elements of the electronic modules can be selected according to the requirements of the application for which the embodiments are designed. The drawings of this document have not been drawn is scale but have been drafted for the purpose of illustrating the mutual relations of the relevant features according to the embodiments. However, some non-binding guidelines for the relevant dimensions are discussed in the following with reference to FIG. 11. The disclosed dimensions can be used also in the embodiments of FIGS. 1 to 10 discussed above, and as starting points for developing electronic modules for various applications.

Figure 11:
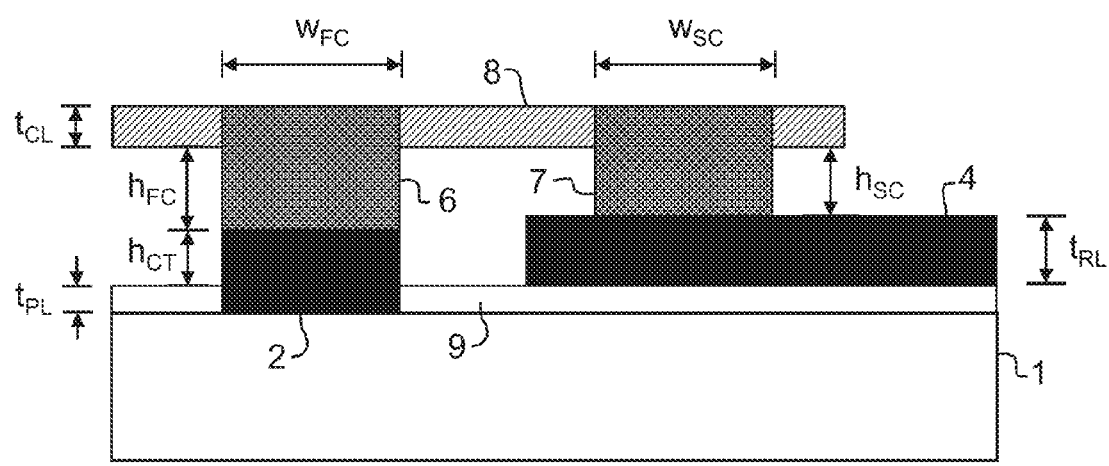
FIG. 11 presents a cross section of two contacts according an embodiment.

FIG. 11 shows a part of the component 1 and the conductor structures connected thereto. The various parameters shown in FIG. 11 may take, for example, the following numerical values:

The thickness $t_{PL}$ of the additional passivation layer 9 is less than 30 micrometers and typically between 3-10 micrometers. In some embodiments, additional passivation layers 9 as thin as 1-5 micrometers can also be used.

The height $h_{CT}$ of the contact terminal 2 from the surface of the additional passivation layer 9 is less than 30 micrometers, such as 5-10 micrometers.

The height $h_{FC}$ of the first contact elements 6, as measured from the surface of the contact terminal 2 up to the "lower" surface of the conducting line 8, is less than 40 micrometers, such as 5-20 micrometers.

The thickness $t_{CL}$ of the conducting line 8 is less than 60 micrometers, such as 5-20 micrometers.

The thickness $t_{RL}$ of the conducting pattern 4 is less than 20 micrometers, such as 3-10 micrometers.

The height $h_{SC}$ of the second contact elements 7, as measured from the surface of the conducting pattern 4 up to the "lower" surface of the conducting line 8, is less than 100 micrometers, typically less than 40 micrometers, such as 5-20 micrometers.

The maximum width $w_{FC}$ of the first contact elements 6, in a direction parallel to the first surface of the component 1, is less than 100 micrometers, such as 15-50 micrometers.

The maximum width $w_{SC}$ of the second contact elements 7, in the direction parallel to the first surface of the component 1, is less than 300 micrometers, typically less than 100 micrometers, such as 15-50 micrometers.

As can be seen from the above exemplifying values, the spacing between the component 1 and the conducting lines 8 can be less than 30 micrometers, for instance.

In an embodiment, the first contact elements 6 are narrower that the contact terminals 2 with which they make contact. In such an embodiment, the width of the first contact element 6 can be, for example, between 60% and 90% of the respective width of the respective contact terminal 2.

The embodiments of the electronic module generally comprise a first wiring layer 3, a dielectric 5 supporting the first wiring layer 3 and a component 1 having a first surface and at least one contact terminal 2 on the first surface. There is an additional passivation layer 9 on the first surface of the component 1, which additional passivation layer 9 is in contact with the dielectric 5. There is also a conducting pattern 4 on the first surface side of the component 1, more particularly on the additional passivation layer 9. The conducting pattern 4 is not in direct contact with the at least one contact terminal 2 but is spaced apart from each of said contact terminals 2. Of course, the presence of one or more of such conducting patterns 4 does not exclude the possibility of the electronic module further comprising other conducting tracks on the first surface side of the component 1 that are in fact in direct contact with the contact terminals 2. The embodiments of the electronic module also comprise at least one first contact element 6 that extends inside the dielectric 5 and forms at least one electrical connection between the first wiring layer 3 and the at least one contact terminal 2. The embodiments of the electronic module further comprise at least one second contact element 7 that also extends inside the dielectric 5 and forms at least one electrical connection between the first wiring layer 3 and the conducting pattern 4.

The embodiments of the electronic module that are designed for the purpose of enhancing wireability typically comprise the first wiring layer 3 and the component 1 having contact terminals 2 and the first surface extending between the contact terminals 2. The electronic module further comprises the conducting pattern 4 on the first surface side of the component 1 and spaced apart from the contact terminals 2. The electronic module is also provided with the first contact elements 6 connecting at least some of the contact terminals 2 to the first wiring layer (3), and the second contact elements 7 connecting the conducting pattern 4 to the first wiring layer 3 at at least two contact locations. In addition, the electronic module comprises the dielectric 5 between the first wiring layer 3 and the conducting pattern 4.

In a further embodiment, the component comprises an additional passivation layer 9 on the first surface between the contact terminals 2. In such an embodiment, the conducting pattern 4 can be manufactured on the surface of the additional passivation layer 9.

In a further embodiment, the first wiring layer 3 comprises at least two separate conducting lines 8 that are electrically connected to each other by means of the second contact elements 7 and the conducting pattern 4.

In an even further embodiment, the first wiring layer 3 comprises at least two separate conducting lines 8 and at least one of said conducting lines 8 crosses the conducting pattern 4 between said at least two contact locations.

In an even further embodiment, the module structure is an embedded structure such as the first wiring layer 3, the conducting pattern 4, the component 1, the first contact elements 6, and the second contact elements 7 are embedded in the dielectric 5.

In a further embodiment having the conducting lines 8 in the first wiring layer 3, the module comprises at least one electrically conducting path from the conducting pattern 4 to the contact terminals 2 such that each of said paths passes through at least one of the second contact elements 7, at least one of the conducting lines 8, and at least of the first contact elements 6.

In an embodiment, there is a spacing of less than 100 micrometers between the first wiring layer 3 and the first surface of the component 1. In a further embodiment, the spacing is in the range of 10 to 60 micrometers.

In an embodiment, each of the first contact elements 6 has a first height of less than 70 micrometers from the respective contact terminal 2 to the respective portion of the first wiring layer 3. In a further embodiment, the first height is in the range of 10 to 30 micrometers.

In an embodiment, each of the second contact elements 7 has a second height of less than 70 micrometers from the respective conducting pattern 4 to the respective portion of the first wiring layer 3. In a further embodiment, the second height is in the range of 10 to 30 micrometers.

In a further embodiment, the first contact elements 6 and the second contact elements 7 are made of same materials and are similar in structure.

In an embodiment, each of the first contact elements 6 has a maximum width of less than 100 micrometers in the direction parallel to the first surface of the component 1. In a further embodiment, the width is in the range of 15 to 50 micrometers.

In an embodiment, the conducting pattern has a thickness of less than 70 micrometers from the first surface of the component 1. In a further embodiment, the thickness is in the range of 5 to 20 micrometers.

In an embodiment, the contact terminals 2 are contact bumps protruding from the first surface of the component 1 and having thicknesses of less than 70 micrometers, for example 10 to 30 micrometers.

In a further embodiment, the contact terminals 2 are contact bumps protruding from the first surface of the component 1, and the contact bumps and the conducting pattern 4 are made of same materials and are similar in structure.

In an embodiment, the conducting pattern 4 is a planar structure intended to be connected to a ground potential for proving a shield against electromagnetic interference between the component 1 and the first wiring layer 3.

In an embodiment, the electronic module comprises a plurality of conducting patterns 4 on the first surface side of the component 1, which conducting patterns 4 are spaced apart from the contact terminals 2.

An embodiment of a method for manufacturing the above-described electronic modules comprises:
providing a component 1 having a first surface and at least one contact terminal 2 on the first surface,
providing an additional passivation layer 9 on the first surface of the component 1,
providing a conducting pattern 4 on the additional passivation layer 9, which conducting pattern 4 is spaced apart from each of the at least one contact terminal 2,
providing a first wiring layer 3,
providing a dielectric 5 in contact with the additional passivation layer 9, which dielectric 5 supports the first wiring layer 3,
providing at least one first contact element 6 extending inside the dielectric 5 for making at least one electrical connection between the first wiring layer 3 and the at least one contact terminal 2, and
providing at least one second contact element 7 extending inside the dielectric 5 for making at least one electrical connection between the first wiring layer 3 and the conducting pattern 4.

Another embodiment of a method for manufacturing the above-described electronic modules comprises:
providing the first wiring layer 3,
providing the component 1 having the contact terminals 2 and the first surface extending between the contact terminals 2,
providing an additional passivation layer 9 on the first surface of the component 1,
providing the conducting pattern 4 on the additional passivation layer 9 and spaced apart from the contact terminals 2,
providing the dielectric 5 that extends between the first wiring layer 3 and the conducting pattern 4,
providing the first contact elements 6 connecting at least some of the contact terminals 2 to the first wiring layer 3, and
providing the second contact elements 7 connecting the conducting pattern 4 to the first wiring layer 3 at the at least two contact locations.

Another embodiment of the method comprises growing conductive material on the contact terminals 2 of the component 1 to form part of the contact terminals 2, and simultaneously growing conductive material on the additional passivation layer 9 to form the conducting pattern 4. Such growing may be affected by a suitable deposition method, such as chemical and/or electrochemical plating.

A further embodiment of the method comprises growing conductive material to form first contact elements 6, and simultaneously growing conductive material to form the second contact elements 7. Also in this embodiment, the growing may be affected by a suitable deposition method, such as chemical and/or electrochemical plating. Other possible deposition methods include vaporization and sputtering, for instance. Alternatively, the conductive material may be conductive paste, conductive polymer, conductive adhesive or solder, for instance.

The component 1 described in the above embodiments can be any suitable component. Component can be, for example, a semiconductor chip, such as a microcircuit. The component 1 can also be a LED, resistor, capacitor, inductor etc. if desired. All the components of suitable size and having suitably located contact terminals 2, or other corresponding terminals, can be used in the described electronic modules.

In case of a microcircuit, the chip comprises pre-processed microelectronic devices on its active surface and typically a additional passivation layer 9 over the microelectronic devices that protect the active surface of the chip. The microcircuits can be so called bare chips, i.e. chips that have not been subject to packaging process but are substantially in the form they left the semiconductor manufacturing process and the succeeding dicing. The chips may have pre-processed contact bumps as their contact terminals 2, or be bumpless chips without such contact bumps. The contact bumps are suitably manufactured at the same time and in the same process with the manufacture of the conducting patterns 4. In case the contact lands of the component are made of aluminium (Al) and the material of the first contact terminals 6 is mainly copper, it would be beneficial to provide the contact terminals 2 with an interlayer for matching the properties of aluminium and copper. Such an interlayer may contain at least one of: chrome (Cr), titanium-wolfram (TiW), nickel (Ni) and gold (Au).

The first and second contact elements 6 and 7 can be made of metal, for instance. The first and second contact elements 6 and 7 can be, for example, solid metal structures produced by chemical vapour deposition and/or electrolytic plating. The contact elements can contain two or more metals as layers, for instance. It is also possible that the contact elements are made of one metal only. Such one metal may be copper (Cu), for instance.

The electronic modules in the above embodiments comprise the dielectric 5 that supports the conducting lines 8. The dielectric 5 also fills the gap between the component 1 and the conducting lines 8. The dielectric 5 serves as an electrical insulator and also as a mechanical structural element binding and attaching the component 1, conducting lines 8 and the other structural parts together to form a single structural entity. The dielectric 5 can comprise one layer or several layers of dielectric material that are bonded together by lamination during the manufacturing process. In addition to the layer-form dielectric materials, the dielectric can also contain portions made of insulating adhesives, for instance. For example, the portion of the dielectric 5 between the component 1 and the conducting lines 8 can be conveniently made of electrically insulating adhesive 18, for instance. In general, the layers may contain mutually same dielectric material or materials, or may be of different dielectric materials. At least one of the layers may be, for example, an epoxy layer reinforced with glass fibres, such as a layer manufactured from FR4 sheet. Also other layers and materials can be used as is known in the circuit board manufacturing industry.

In the embodiments of FIGS. 1 to 11, the first wiring layer 3 is substantially planar and the first contact elements 6 extend straight from the contact terminals 2 to the respective conducting lines 8 in a direction perpendicular to the planar first wiring layer 3. Thus, the length of the first contact elements 6 corresponds to the distance from the surface of the contact terminal 2 to the respective conducting line 8. Hence, the first contact elements 6 are short. Corresponding comments apply also to the second contact elements 7. Short and straight contact elements provide enhanced electrical properties compared to wire-bonded contact elements, for instance.

Figure 12:
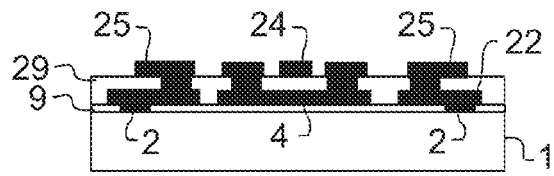
FIG. 12 presents an embodiment wherein a component has two redistribution layers.

The above embodiments can be modified also so that two redistribution layers are manufactured on the component, whereby wiring capability is further increased at least in some applications. FIG. 12 presents a component 1 having such layers.

The component 1 of FIG. 12 has contact terminals 2, such as contact lands or more typically contact bumps, and a first surface of the component 1 extending between and around the contact terminals 2. The first surface is covered by an additional passivation layer 9.

The component 1 of FIG. 12 has been provided with conducting patterns 4 on the additional passivation layer 9 on the first surface of the component 1. Such conducting patterns 4 run on the first surface side of the component 1 between the contact terminals 2 but are not in direct contact with the contact terminals 2 but are spaced apart from them. In the same process step, also second conducting patterns 22 can be made that are otherwise similar to the conducting patterns 4 but are in contact with the contact terminals 2. Then, a second additional passivation layer 29 or other insulating layer is made on the surface of the additional passivation layer 9 and the conducting patterns 4 and the second conducting patterns 22. A further layer of conducting patterns can be made on the surface of the second additional passivation layer 29 and connected to the conducting patterns 4 and the second conducting patterns 22 by means of microvias penetrating the second additional passivation layer 29, or by means of other suitable connection structures. The further layer of conducting patterns can comprise such third conducting patterns 24 that are not in direct contact with the microvias and such fourth conducting patterns 25 that are in direct metallurgical contact with the microvias. The conducting patterns 4 on the additional passivation layer 9 on the first surface of the component 1 and the third conducting patters 24 can also be used as a routing conductor not being in direct contact with the contact terminals 2 within an electronic module, a multi-layer printed circuit board or multi-layer component package.

Figure 13:
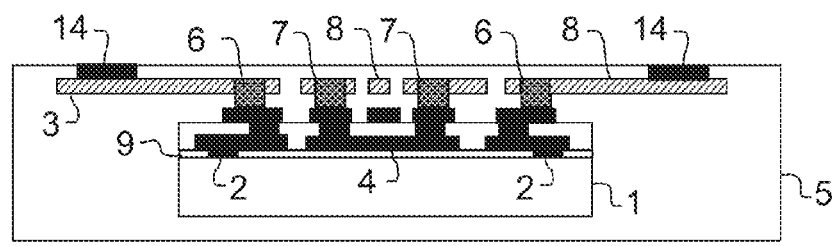
FIG. 13 presents a further embodiment wherein the component with two redistribution layers of FIG. 12 has been embedded in an electronic module.

The electronic module of FIG. 13 comprises the component of FIG. 12 embedded in a dielectric 5. Further, the electronic module of FIG. 13 comprises first and second contact elements 6 and 7 that connect the component of FIG. 12 to conducting lines 8 of a first wiring layer 3. The electronic module is also shown to have terminal pads 14 for making electrical contact with an external electronic circuitry. Thus, the structure of FIG. 13 could be used also as a component package for an integrated circuit, for instance. The structure of FIG. 13 could also be a smart card or a part of a larger circuit board.

As can be seen in FIG. 13, the electronic module is a so called single-layer module, i.e. a module having only one wiring layer (first wiring layer 3). In case the component has several contact terminals 2 and the module structure includes only one wiring layer, certain electrical connections might appear unroutable due to crossing conducting lines 8. However, when using the component of FIG. 12, various crossings can be designed by means of the conducting patterns 4, the second conducting patterns 22, third conducting patterns 24 and fourth conducting patterns 25, and the connections between them. These connections are made by means of the microvias and the first and second contact elements 6 and 7. In the embodiment of FIGS. 12 and 13, the third conducting pattern 24 can be used in a similar way as the conducting patterns 4 in the embodiments of FIGS. 1 to 11.

Figure 14:
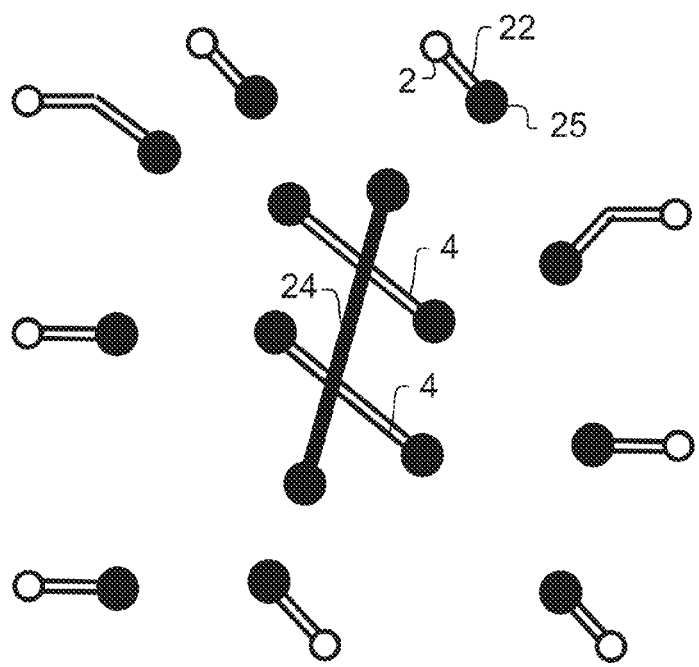
FIG. 14 presents a top view of an embodiment wherein a component has two redistribution layers.

FIG. 14 shows one possible design of redistribution layers in the structure of FIG. 13. In FIG. 14, the contact terminals 2 and the microvias connected to them are shown by unfilled circles. The the second conducting patterns 22 that are in direct connection to the contact terminal microvias are also shown by unfilled lines. Also the conducting patterns 4 that are not in direct connection to the contact terminal microvias are shown in the same way. All these features are covered by the second additional passivation layer 29. FIG. 14 also shows the third conducting pattern 24 that runs on the surface of the second additional passivation layer 29 and the fourth conducting patterns 25 that are connected to the second conducting patterns 22 by means of microvias (under the fourth conducting patterns 25 in FIG. 14) that extend through the second additional passivation layer 29. The third conducting pattern 24 and the fourth conducting patterns 25 are drawn in black.

FIGS. 13 and 14 show that the third conducting pattern 24 and the conducting patterns 4 can cross each other without making electrical contact as they are separated by the second additional passivation layer 29. Therefore, further routing possibilities arise in such embodiments.

The above description is only to exemplify the invention and is not intended to limit the scope of protection offered by the claims. The claims are also intended to cover the equivalents thereof and not to be construed literally.

The invention claimed is:

1. An electronic module comprising:
   a first wiring layer,
   a dielectric supporting the first wiring layer,
   a component having a first surface and at least one contact terminal on the first surface, said at least one contact terminal having a contact bump protruding from the first surface of the component,
   an additional passivation layer on the first surface of the component and in contact with the dielectric,
   a conducting pattern on the additional passivation layer on the first surface of the component and spaced apart from each of the at least one contact terminal, wherein the contact bump and the conducting pattern are made of same material or materials and are similar in structure
   at least one first contact element extending inside the dielectric for making at least one electrical connection between the first wiring layer and the at least one contact terminal, and
   at least one second contact element extending inside the dielectric for making at least one electrical connection between the first wiring layer and the conducting pattern.

2. The electronic module of claim 1, wherein the at least one first contact element comprises a plurality of first contact elements, and the at least one contact terminal comprises a contact terminal for each of the first contact elements.

3. The electronic module of claim 1, wherein the at least one second contact element comprises at least two second contact elements for making at least two electrical connection between the first wiring layer and the conducting pattern at at least two contact locations.

4. The electronic module of claim 3, wherein the first wiring layer comprises at least two separate conducting lines electrically connected to each other by means of the at least two second contact elements and the conducting pattern.

5. The electronic module of claim 3, wherein the first wiring layer comprises at least two separate conducting lines and at least one of said conducting lines crosses the conducting pattern between said at least two contact locations.

6. The electronic module according to claim 1, wherein the additional passivation layer contains polymer or epoxy.

7. The electronic module according to claim 1, wherein the thickness of the additional passivation layer is between 3 and 10 micrometers.

8. The electronic module according to claim 1, wherein the dielectric comprises a layer of insulating adhesive between the component and the first wiring layer.

9. The electronic module according to claim 1, wherein the first wiring layer, the conducting pattern, the component, the first contact elements, and the second contact elements are embedded in the dielectric.

10. The electronic module according to claim 1, wherein the first wiring layer comprises at least one conducting line, the module comprises at least one electrically conducting path from the conducting pattern to the at least one contact terminal, and
    each electrically conducting path from the conducting pattern to the at least one contact terminal passes through the at least one second contact element, the at least one conducting line, and the at least one first contact elements.

11. The electronic module of claim 10, wherein the at least one second contact element comprises at least two second contact elements for making at least two electrical connections between the first wiring layer and the conducting pattern at at least two contact locations.

12. The electronic module of claim 11, wherein the first wiring layer comprises at least two separate conducting lines electrically connected to each other by means of the at least two second contact elements and the conducting pattern, wherein the first wiring layer comprises at least two separate conducting lines and at least one of said conducting lines crosses the conducting pattern between said at least two contact locations.

13. The electronic module according to claim 1, having a spacing between the first wiring layer and the first surface of the component, wherein the spacing is less than 100 micrometers.

14. The electronic module according to claim 1, wherein the conducting pattern is a planar structure intended to be connected to a ground potential for proving a shield against electromagnetic interference between the component and the first wiring layer.

15. The electronic module according to claim 1, comprising a plurality of conducting patterns on the additional passivation layer on the first surface of the component, wherein each conducting pattern is spaced apart from each contact terminal.

16. The method of claim 1, wherein the method comprises:
    growing conductive material to form first contact elements, and
    simultaneously growing conductive material to form the second contact elements.

17. An electronic module comprising:
    a first wiring layer,
    a dielectric supporting the first wiring layer,
    a component having a first surface and at least one contact terminal on the first surface, said at least one contact terminal having at least one contact bump protruding from the first surface of the component and having a thickness of less than 70 micrometers,
    an additional passivation layer on the first surface of the component and in contact with the dielectric,
    a conducting pattern on the additional passivation layer on the first surface of the component and spaced apart from each of the at least one contact terminal, wherein the conducting pattern has a thickness from a surface of the additional passivation layer of less than 70 micrometers,
    at least one first contact element extending inside the dielectric for making at least one electrical connection between the first wiring layer and the at least one contact terminal, and
        at least one second contact element extending inside the dielectric for making at least one electrical connection between the first wiring layer and the conducting pattern.

18. The electronic module according to claim 17, comprising a plurality of conducting patterns on the additional passivation layer on the first surface of the component, wherein each conducting pattern is spaced apart from each contact terminal.

19. An electronic module comprising:
    a first wiring layer,
    a dielectric supporting the first wiring layer,
    a component having a first surface and at least one contact terminal on the first surface,
    an additional passivation layer on the first surface of the component and in contact with the dielectric,
    a conducting pattern on the additional passivation layer on the first surface of the component and spaced apart from each of the at least one contact terminal,
    at least one first contact element extending inside the dielectric for making at least one electrical connection between the first wiring layer and the at least one contact terminal, each of the at least one first contact element having a first height from the respective contact terminal to the respective portion of the first wiring layer, said first height being less than 70 micrometers, and each of the at least one first contact element having a maximum width in a direction parallel to the first surface of the component, said width being less than 100 micrometers, and at least one second contact element extending inside the dielectric for making at least one electrical connection between the first wiring layer and the conducting pattern, each of the at least one second contact element has a second height from the respective conducting pattern to the respective portion of the first wiring layer, said second height being less than 70 micrometers.

20. The electronic module according to claim 19, comprising a plurality of conducting patterns on the additional passivation layer on the first surface of the component, wherein each conducting pattern is spaced apart from each contact terminal.

* * * * *